United States Patent
Kim et al.

(10) Patent No.: US 8,445,989 B2
(45) Date of Patent: May 21, 2013

(54) SEMICONDUCTOR DEVICE

(75) Inventors: Ba Wool Kim, Icheon (KR); Won Ho Shin, Seoul (KR)

(73) Assignee: Hynix Semiconductor Inc., Icheon-Si (KR)

( * ) Notice: Subject to any disclaimer, the term of this patent is extended or adjusted under 35 U.S.C. 154(b) by 199 days.

(21) Appl. No.: 12/956,948

(22) Filed: Nov. 30, 2010

(65) Prior Publication Data
US 2012/0001294 A1    Jan. 5, 2012

(30) Foreign Application Priority Data
Jul. 2, 2010    (KR) ................. 10-2010-0063991

(51) Int. Cl.
*H01L 27/10*   (2006.01)
*H01L 29/00*   (2006.01)
*H01L 23/58*   (2006.01)
*H01L 23/62*   (2006.01)

(52) U.S. Cl.
USPC ........... 257/529; 257/528; 257/209; 257/665; 257/530

(58) Field of Classification Search
USPC ................. 257/529, 209, 665, 528, 208, 50, 257/530
See application file for complete search history.

(56) References Cited

U.S. PATENT DOCUMENTS 8,076,780 B2 * 12/2011 Saigoh et al. ................. 257/760
2004/0007778 A1 * 1/2004 Shinozaki et al. ............ 257/759

FOREIGN PATENT DOCUMENTS

KR    1020080097093 A    11/2008
KR    1020100002673 A    1/2010

* cited by examiner

*Primary Examiner* — Chuong A. Luu

(57) ABSTRACT

A semiconductor device includes a first metal wiring which is formed over substructure; a first contact plug which is coupled to the first metal wiring and passes through a first interlayer insulating film provided over the substructure; a second metal wiring which is provided over the first interlayer insulating film and is coupled to the first contact plug; a second contact plug which is coupled to the second metal wiring and passes through a second interlayer insulating film which is provided over the first interlayer insulating film; and a fuse pattern and a data read fuse pattern which are coupled to the second contact plug and provided over the second interlayer insulating film.

11 Claims, 2 Drawing Sheets

SEMICONDUCTOR DEVICE

CROSS-REFERENCES TO RELATED APPLICATIONS

The present application claims priority to Korean patent application number 10-2010-0063991, filed on Jul. 2, 2010, which is incorporated by reference in its entirety.

BACKGROUND OF THE INVENTION

The present invention relates to a semiconductor device, and more particularly, to a semiconductor device for improving a fuse cutting error.

Semiconductor devices like a memory device and a memory merged logic (MML) device include numerous memory cells for storing data. However, when any one of the memory cells fails, the semiconductor device also fails, so that the yield is decreased. It is not cost-effective to discard the whole device even when defects are generated only in a part of cells of the semiconductor device. Hence, in a semiconductor device, a repair function is required to increase the yield. A semiconductor device employs a method of replacing a defective cell with a redundant cell. A cuttable fuse is used to replace the defective cell with the redundant cell. Accordingly, a plurality of fuses is included in the semiconductor device, and these fuses can be cut by laser. The fuses are selectively cut according to a test result after the semiconductor device is tested.

The repairing method using the redundant cell previously sets a redundant word line provided to replace a normal word line and a redundant bit line provided to replace a normal bit line in a given cell array, and replaces the normal word line or the normal bit line which includes a failed cell with the redundant word line or the redundant bit line to repair the failed cell.

To this end, the memory device includes a circuit for replacing an address corresponding to the failed cell with an address of the redundant cell when the failed cell is chosen through the test after the wafer fabrication is completed. Accordingly, when an address signal corresponding to the failed cell is inputted, data of the replaced redundancy cell corresponding to the failed cell is accessed.

The most widely used method among repairing methods is a method of burning a fuse with a laser beam to perform blowing, so that a route of the address is replaced to select the redundant cell. Accordingly, the memory device includes a fuse unit which can change the address route by irradiating a laser to the fuse. In this description, a fuse refers to a wiring which is cut by the irradiation of a laser, and a fuse box refers to an area surrounding the fuse.

BRIEF SUMMARY OF THE INVENTION

Embodiments of the present invention are directed to a semiconductor device capable of improving the signaling of a fuse such that fuse cutting information is accurately sent in case increased resistance affects a property of a bit line when blowing out the fuse.

According to an embodiment of the present invention, the semiconductor device includes a first metal wiring provided over a substrate; a plurality of first contact plugs coupled to the first metal wiring and passing through a first interlayer insulating film provided in an upper portion of the substrate; a second metal wiring provided in an upper portion of the first interlayer insulating film and coupled to the plurality of first contact plugs; a plurality of second contact plug coupled to the second metal wiring and passing through a second interlayer insulating film provided over the first interlayer insulating film; a fuse pattern coupled to a first one of the second contact plugs and provided over the second interlayer insulating film; and a data read fuse pattern coupled a second one of the second contact plugs and provided over the second interlayer insulating film. A signal of the fuse pattern is sensed by the data read fuse pattern through the first contact plug and the first metal wiring. The first metal wiring includes a gate. The second metal wiring includes a bit line. The first metal wiring includes a line type. The plurality of first contact plugs includes two first contact plugs respectively coupled to a first end and a second end of the first metal wiring. The first metal wiring includes a fishbone type. The first contact plug is connected to ends of the first metal wiring of fishbone type.

The present invention provides an effect that repair efficiency increases by accurately sending the signaling of fuse even when the bit line property is affected to increase resistance in the fuse blowing.

DESCRIPTION OF EMBODIMENTS

Hereinafter, exemplary embodiments of the present invention are illustrated in detail with reference to the accompanying drawings.

When energy is transferred to a contact plug provided in both ends of a fuse pattern in the fuse pattern, the resulting blowing of a fuse may change the properties of a bit line connected to the contact plug such that resistance is increased. The present invention changes a transmission path of a signal of the fuse pattern so that a sensing error resulting from a signal sent from the fuse pattern that may be sensed as 'low' instead of 'high' can be prevented. In accordance with embodiments of the present invention, a fuse structure of a semiconductor device for changing the transmission path of the fuse pattern signal is illustrated with reference to FIGS. 1 and 2.

Figure 1:
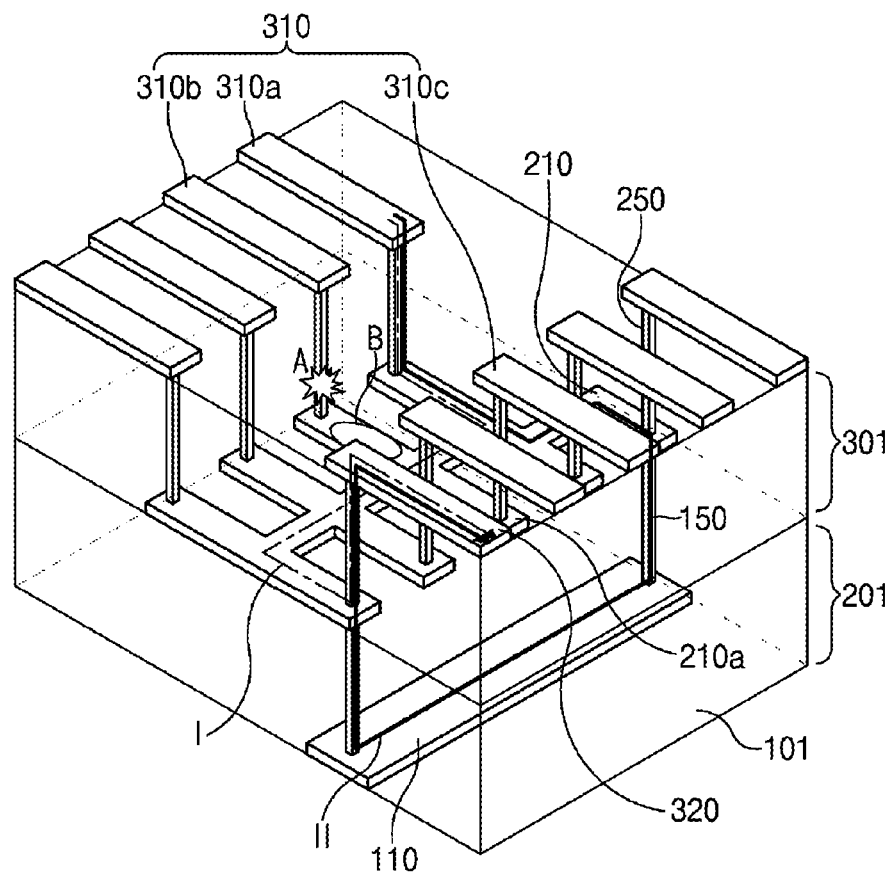
FIG. 1 is a perspective view showing a semiconductor device according to a first embodiment of the present invention.

FIG. 1 is a perspective view showing a semiconductor device according to a first embodiment of the present invention. In FIG. 1, the semiconductor device includes a metal wiring 110 formed over a substructure 101 provided on a semiconductor substrate (not shown), a first contact plug 150 passing through a first interlayer insulating film 201 provided over the substructure 101 to be connected to the metal wiring 110, a bit line 210 provided over the first interlayer insulating film 201 and connected to the first contact plug 150, a second contact plug 250 passing through a second interlayer insulating film 301 provided over the first interlayer insulating film 201 while being connected to the bit line 210, a fuse pattern 310 connected to the second contact plug 250 and provided over the second interlayer insulating film 301, and a data read fuse pattern 320.

Here, the metal wiring 110 may be a line type and include a gate. The first contact plug 150 and the metal wiring 110 construct a new route through which a signal of the fuse pattern 310 is transferred. That is, the signal of the fuse pattern 310 is transferred through the first contact plug 150 and the metal wiring 110, so that wrong information can be prevented from being sensed by the data read fuse pattern 320 when the signal of the fuse pattern 310 is transmitted through the bit line 210. When attacking area 'A' indicated on FIG. 1 to blow the fuse pattern 310, it is possible that the properties of the bit line 210 may be changed in the area marked as 'B' such that the resistance of the bit line 210 is increased. In more detail, it is illustrated with reference to signal transmission paths I and II of a fuse pattern 310a.

In the signal transmission path I of the fuse pattern 310a, a signal of the fuse pattern 310a is applied to the bit line 210 through the second contact plug 250 and sensed by the data read fuse pattern 320 through the bit line 210. At this time, since the signal of the fuse pattern 310a has a voltage which has dropped while passing through a bit line 210a having increased resistance like the affected area 'B', it is sensed by the data read fuse pattern 320 as 'low' not 'high' such that a sensing error occurs.

In the signal transmission path II of the fuse pattern 310a, the signal of the fuse pattern 310a is applied to an end of one side of the bit line 210 through the second contact plug 250, sent to the first contact plug 150 connected to the bit line 210, applied again to an end of the other side of the bit line 210 through the metal wiring 110, and sensed by the data read fuse pattern 320 which is connected to the end of the other side of the bit line 210 through the second contact plug 250. That is, the signal of the fuse pattern 310a does not pass through the bit line 210a having the increased resistance like the affected area 'B' and is sensed by the data read fuse pattern 320 through a new route including the first contact plug 150 and the metal wiring 110, such that the sensing error does not occur.

The signal of the fuse pattern 310a is sent to the data read fuse pattern 320 through two routes I and II. Thus, although the signal is transmitted through the route I and sensed as 'low', it can be sensed as 'high' by the route II, so that the signal of the fuse pattern 310a is sensed as 'high'. Accordingly, the signal of the fuse pattern 310a is accurately sensed.

As described above, in accordance with the embodiment of the present invention, the signal of the fuse pattern is transmitted through a new route including the first contact plug and the metal wiring, so that it can prevent a sensing error from occurring when the signal is sensed by the data read fuse pattern.

However, when energy is transferred to the second contact plug 250 connected to a fuse pattern 310b and the property of the bit line 210a is changed at the affected area 'B' when blowing out the fuse pattern 310b, a signal of a fuse pattern 310c adjacent to the fuse pattern 310b has a voltage drop while passing through the bit line 210a so as to be sensed by the data read fuse pattern 320. That is, because there is no route through which the signal of the fuse pattern 310b can be applied to the metal wiring 110 through the first contact plug 150, a sensing error may occur when the signal passes through the bit line 210a including the affected area 'B'.

Accordingly, in the following second embodiment of the present invention, a structure is illustrated in which signals of all fuse patterns having the increased resistance, including the fuse pattern 310b connected to the bit line 210a, do not generate a sensing error and can be accurately sensed by the data read fuse pattern.

Figure 2:
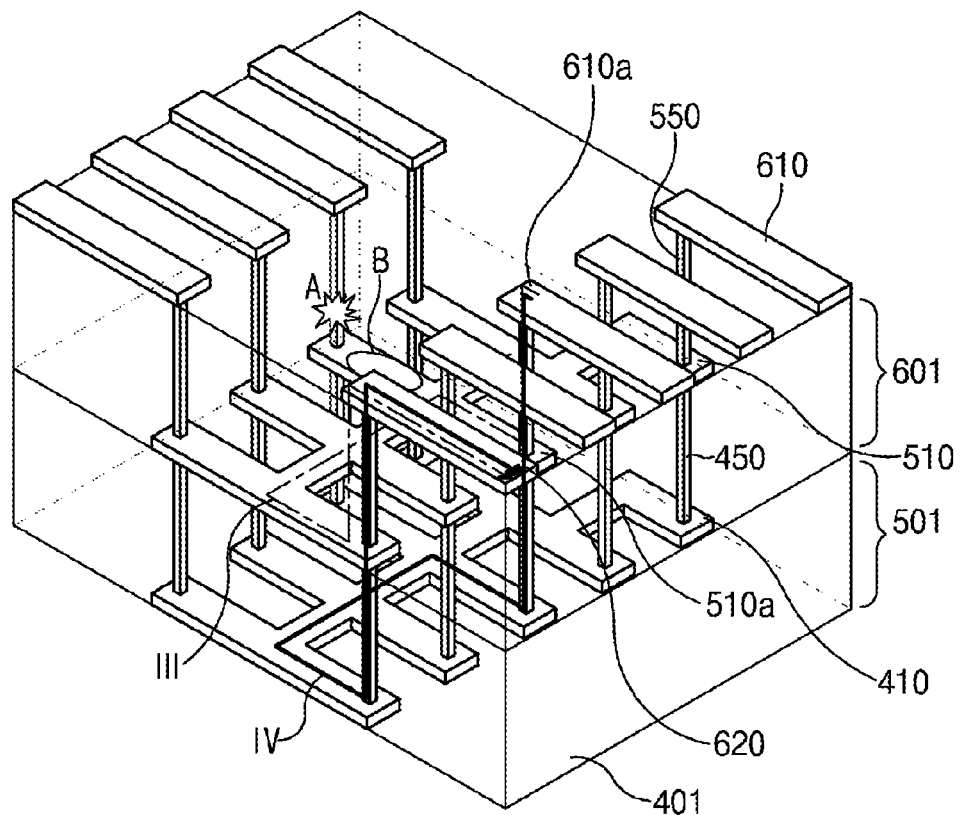
FIG. 2 is a perspective view showing a semiconductor device according to a second embodiment of the present invention.

FIG. 2 is a perspective view showing a semiconductor device according to a second embodiment of the present invention. In FIG. 2, the semiconductor device includes a metal wiring 410 formed over a substructure 401 provided on a semiconductor substrate (not shown), a first contact plug 450 passing through a first interlayer insulating film 501 provided over the substructure 401 to be connected to the metal wiring 410, a bit line 510 provided over the first interlayer insulating film 501 and connected to the first contact plug 501, a second contact plug 550 passing through a second interlayer insulating film 601 provided over the first interlayer insulating film 501 while being connected to the bit line 510, a fuse pattern 610 connected to the second contact plug 550 and provided over the second interlayer insulating film 601, and a data read fuse pattern 620.

Here, the metal wiring 410 may have substantially the same form as the bit line 510. The metal wiring 410 and the bit line 510 may be a fishbone type, and the first contact plug 450 is connected to each end of the metal wiring 410. A gate may be applied to the metal wiring 410.

In the second embodiment, it is illustrated with reference to the signal transmission paths III and IV of a fuse pattern 610a that a signal of the fuse pattern 610a connected to a bit line 510a having increased resistance prevents the occurrence of a sensing error at the data read fuse pattern 620.

In the signal transmission path III of the fuse pattern 610a, the signal of the fuse pattern 610a is applied to the bit line 510a through the second contact plug 550 and is sensed by the data read fuse pattern 620 through the bit line 510a. At this time, since a voltage of the signal of the fuse pattern 610a is dropped while passing by the bit line 510a, the signal is sensed as 'low' not as 'high' at the data read fuse pattern 620, such that a sensing error occurs.

On the other hand, in the signal transmission path IV of the fuse pattern 610a, the signal of the fuse pattern 610a is applied to an end of one side of the bit line 510a through the second fuse contact plug 550, sent to the first contact plug 450 connected to the end of one-side of the bit line 510a and applied to the metal wiring 410, then sent to another first contact plug 450 connected to another end of the metal wiring 410 and applied to the bit line 510, and sensed by the data read fuse pattern 620. That is, the signal of the fuse pattern 610a connected to the bit line 510a is applied to the first contact plug 450 connected to the end of the metal wiring 410 having the fishbone type, so that the voltage drop in passing through the bit line 510a can be prevented.

In the second embodiment, the signal of the fuse pattern 610a is sensed by the data read fuse pattern 620 through a new route including the metal wiring 410 of the fishbone type and the first contact plug 450 connected to the ends of the metal wiring 410, such that the sensing error is prevented.

In this way, since the signal of the fuse pattern 610a is sent to the data read fuse pattern 620 through two routes III and IV, although the signal is transmitted through the route III and sensed as 'low,' it can be sensed as 'high' by the route IV. As a result, the signal of the fuse pattern 610a is accurately sensed as 'high.'

As illustrated in the first embodiment and the second embodiment, the signal of the fuse pattern is transmitted through a new route which is not a bit line having increased resistance, such that a repair operation is accurately made.

It will be apparent to those skilled in the art that modifications and variations can be made in the present invention without departing from the spirit or scope of the invention. Thus, it is intended that the present invention cover the modifications and variations of this invention provided they come within the scope of the appended claims and their equivalents.

What is claimed is:

1. A semiconductor device, comprising:
   a fuse pattern provided over an interlayer insulating film provided over a substrate; and
   a data read fuse pattern disposed over the interlayer insulating film and separate from the fuse pattern, the data read fuse pattern sensing a signal of the fuse pattern through a first route and a second route, wherein the first route includes a first metal wiring provided under the fuse pattern, a first contact plug coupled to a first end portion of the first wiring, and a second contact plug coupled to a second end portion of the first wiring, wherein the second route includes a second metal wiring provided under the first metal wiring, a third contact plug coupled to a first end portion of the second wiring, and a fourth contact plug coupled to a second end portion of the second wiring, wherein the third contact plug is disposed under the first contact plug and coupled to a first end of the first contact plug and the fourth contact plug is disposed under the second contact plug and coupled to a first end of the second contact plug, and wherein a second end of the first contact plug is coupled to the fuse pattern and a second end of the second contact plug is coupled to the data read fuse pattern.

2. The semiconductor device of claim 1, wherein a configuration of the first metal wiring includes a fish bone shape so that a plurality of separate end portions of the first metal wiring is coupled to each other by a center portion thereof.

3. The semiconductor device of claim 2, wherein the first contact plug and the second contact plug are respectively provided over two end portions of the first metal wiring.

4. The semiconductor device of claim 1, wherein a configuration of the second metal wiring includes a fish bone shape so that a plurality of separate end portions of the second metal wiring is coupled to each other by a center portion thereof.

5. The semiconductor device of claim 4, wherein the third contact plug and the fourth contact plug are respectively provided over two end portions of the second contact plug.

6. The semiconductor device of claim 1, wherein the second metal wiring includes a gate.

7. The semiconductor device of claim 1, wherein the first metal wiring includes a bit line.

8. The semiconductor device of claim 7, wherein the first route passes the bit line, the bit line having a property changed by a fuse cutting process.

9. The semiconductor device of claim 7, wherein the second route does not pass the bit line, the bit line having a property changed by a fuse cutting process.

10. The semiconductor device of claim 1, wherein the fuse pattern and the data read fuse pattern are separate from each other on a horizontal plane.

11. The semiconductor device of claim 7, wherein the first route passes the bit line, the bit line having a property changed by a fuse cutting process, and wherein the second route does not pass the bit line.

* * * * *